United States Patent
Lee et al.

(10) Patent No.: US 10,204,859 B2
(45) Date of Patent: Feb. 12, 2019

(54) INTERCONNECT STRUCTURE AND FABRICATING METHOD THEREOF

(71) Applicant: MACRONIX International Co., Ltd., Hsinchu (TW)

(72) Inventors: Hong-Ji Lee, Hsinchu (TW); Min-Hsuan Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/415,699

(22) Filed: Jan. 25, 2017

(65) Prior Publication Data

US 2018/0211921 A1 Jul. 26, 2018

(51) Int. Cl.

| | |
|---|---|
| *H01L 23/52* | (2006.01) |
| *H01L 23/532* | (2006.01) |
| *H01L 23/528* | (2006.01) |
| *H01L 21/768* | (2006.01) |
| *H01L 21/3213* | (2006.01) |
| *H01L 23/522* | (2006.01) |

(52) U.S. Cl.
CPC .. *H01L 23/53238* (2013.01); *H01L 21/32139* (2013.01); *H01L 21/76847* (2013.01); *H01L 21/76849* (2013.01); *H01L 21/76892* (2013.01); *H01L 23/528* (2013.01); *H01L 23/53223* (2013.01); *H01L 23/53266* (2013.01); *H01L 23/53295* (2013.01); *H01L 23/5222* (2013.01)

(58) Field of Classification Search
None
See application file for complete search history.

(56) References Cited

U.S. PATENT DOCUMENTS

| | | | | |
|---|---|---|---|---|
| 6,713,381 | B2* | 3/2004 | Barr | H01L 21/76801 257/E21.508 |
| 7,382,049 | B2* | 6/2008 | Ho | H01L 21/563 257/737 |
| 8,823,166 | B2* | 9/2014 | Lin | H01L 24/11 257/737 |
| 8,884,422 | B2* | 11/2014 | Goh | H01L 25/16 257/686 |
| 9,172,004 | B2* | 10/2015 | Choi | H01L 33/387 |
| 2009/0233436 | A1* | 9/2009 | Kim | H01L 24/11 438/614 |
| 2015/0004750 | A1* | 1/2015 | Chi | H01L 24/82 438/108 |

FOREIGN PATENT DOCUMENTS

| | | |
|---|---|---|
| TW | 505984 | 10/2002 |
| TW | 201523805 | 6/2015 |

OTHER PUBLICATIONS

"Office Action of Taiwan Counterpart Application," dated Sep. 15, 2017, p. 1-p. 6, in which the listed references were cited.

* cited by examiner

*Primary Examiner* — Luan C Thai
(74) *Attorney, Agent, or Firm* — J.C. Patents

(57) ABSTRACT

An interconnect structure including a substrate and a conductive pattern is provided. The conductive pattern includes a bottom portion. The bottom portion of the conductive pattern is disposed on the substrate. The conductive pattern has a notch on each of two sidewalls of the bottom portion.

20 Claims, 3 Drawing Sheets

INTERCONNECT STRUCTURE AND FABRICATING METHOD THEREOF

BACKGROUND OF THE INVENTION

Field of the Invention

Figure 1A:
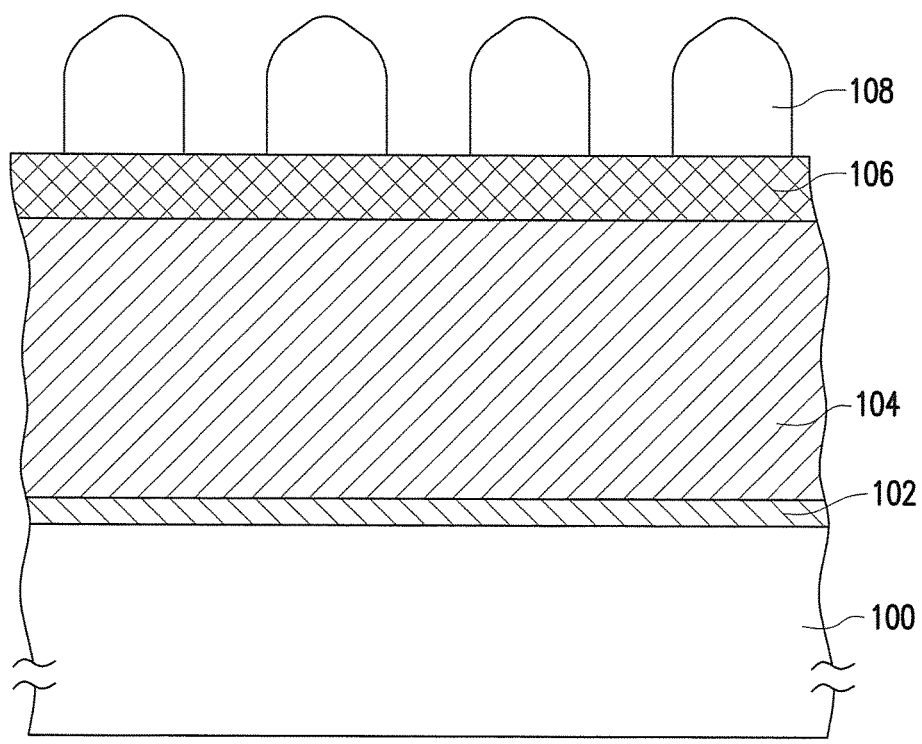

The invention relates to a conductive structure and a fabricating method thereof, and more particularly relates to an interconnect structure and a fabricating method thereof.

Description of Related Art

As the integrity of integrated circuits (ICs) is increased with the development of the semiconductor industry, the chip surface is no longer sufficient for forming the interconnect required. Thus, the multi-layer interconnect design gradually becomes necessary for many integrated circuits.

As the size of semiconductor devices decreases, the overlay window of the upper conductive device and the lower conductive device below in the multi-layer interconnect structure is reduced. For this reason, misalignment may occur easily. When the upper conductive device and the lower conductive device below in the multi-layer interconnect structure are misaligned, the upper conductive device may expose the lower conductive device below. Consequently, a bridging path may be created between adjacent two upper conductive devices by the exposed lower conductive device, which results in the defect of circuit bridging.

SUMMARY OF THE INVENTION

The invention provides an interconnect structure and a fabricating method thereof, which effectively prevent occurrence of a defect of circuit bridging.

The invention provides an interconnect structure, which includes a substrate and a conductive pattern. The conductive pattern includes a bottom portion. The bottom portion of the conductive pattern is disposed on the substrate. The conductive pattern has a notch on each of two sidewalls of the bottom portion.

According to an embodiment of the invention, in the interconnect structure, a position of a minimum width of the conductive pattern is at the notch, for example.

According to an embodiment of the invention, in the interconnect structure, the conductive pattern further includes an intermediate portion and a top portion. The intermediate portion is located between the top portion and the bottom portion. A position of a maximum width of the conductive pattern is at the intermediate portion, for example.

According to an embodiment of the invention, in the interconnect structure, the position of the maximum width of the conductive pattern is a transition position of a positive slope and a negative slope, for example.

According to an embodiment of the invention, the interconnect structure further includes a first barrier layer. The first barrier layer is disposed between the conductive pattern and the substrate.

According to an embodiment of the invention, in the interconnect structure, a width of the first barrier layer may be greater than the minimum width of the conductive pattern.

According to an embodiment of the invention, in the interconnect structure, the notch may be located at an interface between the conductive pattern and the first barrier layer.

According to an embodiment of the invention, the interconnect structure further includes a second barrier layer. The second barrier layer is disposed on the conductive pattern.

According to an embodiment of the invention, the interconnect structure further includes a dielectric layer. The dielectric layer is disposed on the substrate at two sides of the conductive pattern. The notch may be located between the dielectric layer and the conductive pattern.

According to an embodiment of the invention, in the interconnect structure, a material of the conductive pattern is AlCu, Al, or W, for example.

The invention provides a fabricating method of an interconnect structure, which includes the following steps. A substrate is provided. A conductive pattern is formed on the substrate. The conductive pattern includes a bottom portion. The conductive pattern has a notch on each of two sidewalls of the bottom portion.

According to an embodiment of the invention, in the fabricating method, a forming method of the conductive pattern includes the following steps. A conductive pattern material layer is formed on the substrate. A patterned mask layer is formed on the conductive pattern material layer. A first etching process is performed on the conductive pattern material layer with the patterned mask layer as a mask. A first etching gas used in the first etching process includes a $Cl_2$ and a $BCl_3$. In the first etching process, a flow rate of the $BCl_3$ is less than or equal to a flow rate of the $Cl_2$. A second etching process is performed on the conductive pattern material layer with the patterned mask layer as a mask after performing the first etching process. A second etching gas used in the second etching process includes the $Cl_2$ and the $BCl_3$. In the second etching process, the flow rate of the $BCl_3$ is greater than the flow rate of the $Cl_2$.

According to an embodiment of the invention, in the fabricating method, a flow rate ratio of the $BCl_3$ to the $Cl_2$ in the first etching process is 0.3 to 1, for example.

According to an embodiment of the invention, in the fabricating method, a flow rate ratio of the $BCl_3$ to the $Cl_2$ in the second etching process is 1.3 to 5, for example.

According to an embodiment of the invention, in the fabricating method, during the second etching process, a process pressure is 2 mTorr to 30 mTorr, a source RF power is 100 W to 1500 W, and a bias RF power is 15 W to 200 W, for example.

According to an embodiment of the invention, in the fabricating method, the first etching gas and the second etching gas further include a protective gas, respectively.

According to an embodiment of the invention, in the fabricating method, the protective gas is $CH_4$, $N_2$, $CF_4$, $CHF_3$, or a combination of the foregoing, for example.

According to an embodiment of the invention, the fabricating method further includes forming a first barrier layer between the conductive pattern and the substrate.

According to an embodiment of the invention, the fabricating method further includes forming a second barrier layer on the conductive pattern.

According to an embodiment of the invention, the fabricating method further includes forming a dielectric layer on the substrate at two sides of the conductive pattern. The notch may be located between the dielectric layer and the conductive pattern.

Based on the above, in the interconnect structure and the fabricating method thereof according to the invention, the conductive pattern has the notch on each of the two sidewalls of the bottom portion. Therefore, the critical dimension (CD) of the bottom portion of the conductive pattern is reduced to increase the overlay window of the conductive pattern and the conductive devices below, so as to prevent occurrence of the defect of circuit bridging. In addition, because the portions other than the bottom portion of the conductive pattern have greater widths, a larger cross-sectional area is retained to maintain a low resistance and a low resistance capacitance delay (RC delay).

To make the aforementioned and other features and advantages of the invention more comprehensible, several embodiments accompanied with drawings are described in detail as follows.

BRIEF DESCRIPTION OF THE D WINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 1A to FIG. 1E are schematic cross-sectional views illustrating a fabricating method of an interconnect structure according to an embodiment of the invention.

DESCRIPTION OF THE EMBODIMENTS

FIG. 1A to FIG. 1E are schematic cross-sectional views illustrating a fabricating method of an interconnect structure according to an embodiment of the invention.

Referring to FIG. 1A, a substrate 100 is provided. The substrate 100 may be a single-layer substrate or a multi-layer substrate that may have other layers (not shown), conductive devices (not shown), or semiconductor devices (not shown) formed thereon.

A barrier material layer 102 is selectively formed on the substrate 100. A material of the barrier material layer 102 is Ti, TiN, Ta, TaN, or a combination of the foregoing, for example. A method of forming the barrier material layer 102 is physical vapor deposition or chemical vapor deposition, for example.

A conductive pattern material layer 104 is formed on the barrier material layer 102. A material of the conductive pattern material layer 104 is AlCu, Al, or W, for example. A method of forming the conductive pattern material layer 104 is physical vapor deposition or chemical vapor deposition, for example.

A barrier material layer 106 is selectively formed on the conductive pattern material layer 104. A material of the barrier material layer 106 is Ti, TiN, Ta, TaN, or a combination of the foregoing, for example. A method of forming the barrier material layer 106 is physical vapor deposition or chemical vapor deposition, for example.

A patterned mask layer 108 is formed on the barrier material layer 106. A material of the patterned mask layer 108 is a patterned photoresist layer or a patterned hard mask layer, for example. A material of the patterned photoresist layer is a positive photoresist material or a negative photoresist material, for example. A material of the patterned hard mask layer is amorphous carbon, silicon nitride or silicon oxide, for example.

Figure 1B:
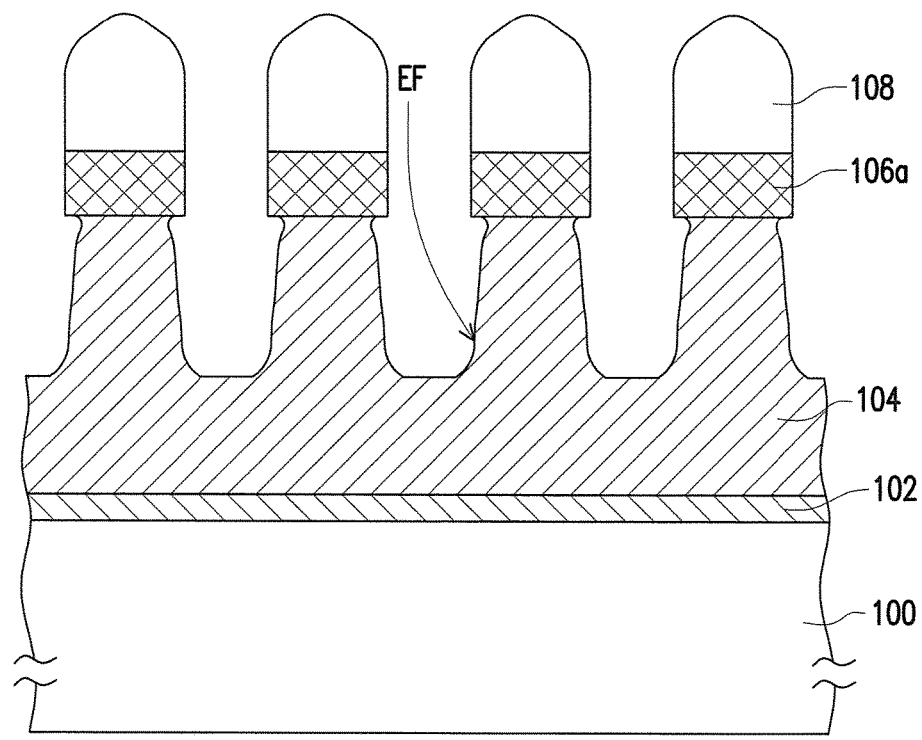

Referring to FIG. 1B, a barrier layer 106a is formed on the conductive pattern material layer 104 by removing a portion of the barrier material layer 106 with the patterned mask layer 108 as a mask. A method of removing the portion of the barrier material layer 106 is to perform an etching process (e.g., a dry etching process) on the barrier material layer 106 with the patterned mask layer 108 as a mask, for example.

A first etching process is performed on the conductive pattern material layer 104 with the patterned mask layer 108 as a mask. After the first etching process, a shape of an etch front EF in the conductive pattern material layer 104 may be similar to a U-shape. The first etching process is a dry etching process, for example.

A first etching gas used in the first etching process includes $Cl_2$ and $BCl_3$. In the first etching process, a flow rate of $BCl_3$ is less than or equal to a flow rate of $Cl_2$. In the first etching process, a flow rate ratio of $BCl_3$ to $Cl_2$ is 0.3 to 1, for example. In an embodiment, the flow rate ratio of $BCl_3$ to $Cl_2$ in the first etching process may be 0.5 to 1.

Moreover, the first etching gas further includes a protective gas. The protective gas is $CH_4$, $N_2$, $CF_4$, $CHF_3$, or a combination of the foregoing, for example. In the first etching process, a flow rate of $CH_4$ is 5 sccm to 20 sccm, a flow rate of $N_2$ is 5 sccm to 20 sccm, a flow rate of $CF_4$ is 0 sccm to 15 sccm, and a flow rate of $CHF_3$ is 0 sccm to 15 sccm, for example.

Moreover, during the first etching process, a process pressure is 2 mTorr to 35 mTorr, a source RF power is 100 W to 1500 W, and a bias RF power is 15 W to 500 W, for example. In an embodiment, during the first etching process, the process pressure is 4 mTorr to 20 mTorr, the source RF power is 400 W to 1200 W, and the bias RF power is 50 W to 200 W, for example.

Figure 1C:
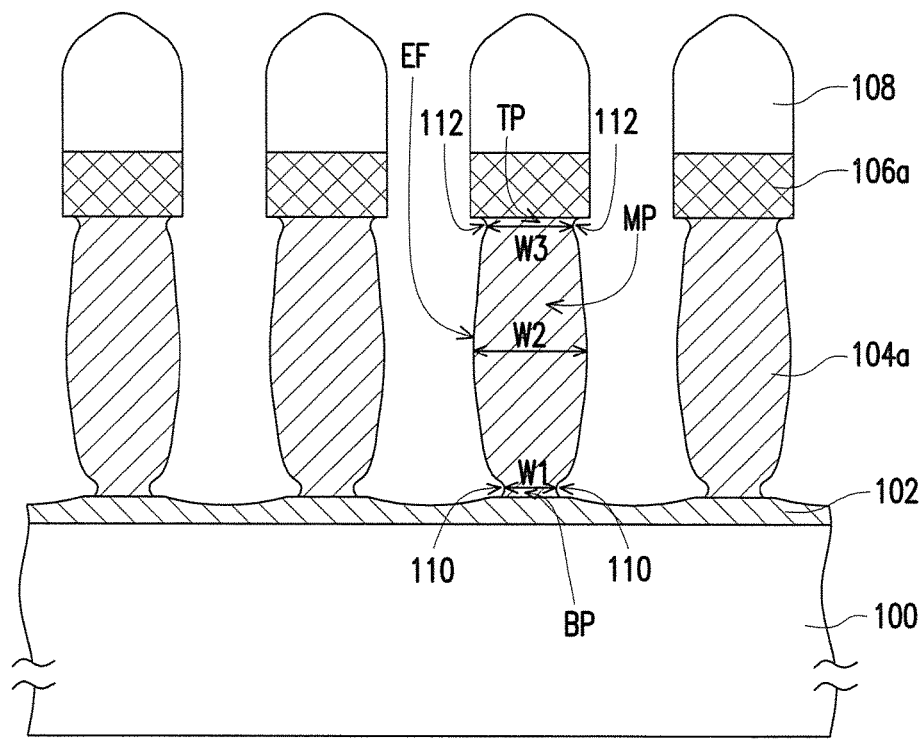

Referring to FIG. 1C, after the first etching process, a conductive pattern 104a is formed on the barrier material layer 102 by performing a second etching process on the conductive pattern material layer 104 with the patterned mask layer 108 as a mask. The second etching process may be an etch front modified etch process. That is, after the second etching process, the shape of the etch front EF in the conductive pattern material layer 104 may be modified from the U-shape to an undercutting shape. Accordingly, the overall shape of the conductive pattern 104a may be similar to a bottle shape. The second etching process is a dry etching process, for example. Besides, during the second etching process, a portion of the barrier material layer 102 may be selectively removed.

A second etching gas used in the second etching process includes $Cl_2$ and $BCl_3$. In the second etching process, a flow rate of $BCl_3$ is greater than a flow rate of $Cl_2$. In the second etching process, a flow rate ratio of $BCl_3$ to $Cl_2$ is 1.3 to 5, for example. In an embodiment, the flow rate ratio of $BCl_3$ to $Cl_2$ in the second etching process may be 1.5 to 2.5.

Moreover, the second etching gas further includes a protective gas. The protective gas is $CH_4$, $N_2$, $CF_4$, $CHF_3$, or a combination of the foregoing, for example. In the second etching process, a flow rate of $CH_4$ is 0 sccm to 5 sccm, a flow rate of $N_2$ is 5 sccm to 20 sccm, a flow rate of $CF_4$ is 0 sccm to 5 sccm, and a flow rate of $CHF_3$ is 0 sccm to 5 sccm, for example.

Furthermore, during the second etching process, a process pressure is 2 mTorr to 30 mTorr, a source RF power is 100 W to 1500 W, and a bias RF power is 15 W to 200 W, for example. In an embodiment, during the second etching process, the process pressure is 2 mTorr to 15 mTorr, the source RF power is 500 W to 1200 W, and the bias RF power is 50 W to 200 W, for example.

The conductive pattern 104a includes a bottom portion BP. The conductive pattern 104a has a notch 110 on each of two sidewalls of the bottom portion BP. The notch 110 reduces a critical dimension (CD) of the bottom portion BP of the conductive pattern 104a to increase an overlay window of the conductive pattern 104a and the conductive devices below, so as to prevent occurrence of a defect of circuit bridging. A position of a minimum width W1 of the conductive pattern 104a is at the notch 110, for example.

The conductive pattern 104a further includes an intermediate portion MP and a top portion TP. The intermediate portion MP is located between the top portion TP and the bottom portion BP. The conductive pattern 104a may selectively has a notch 112 on each of two sidewalls of the top portion TP, but the invention is not limited thereto. In another embodiment, the conductive pattern 104a may not have the notch 112 on two sidewalls of the top portion TP.

In addition, a position of a maximum width W2 of the conductive pattern 104a is at the intermediate portion MP, for example. The position of the maximum width W2 of the conductive pattern 104a is a transition position of a positive slope and a negative slope, for example. A width W3 at the top portion TP may be between the minimum width W1 and the maximum width W2. In this embodiment, the bottom portion BP and the intermediate portion MP may be substantially divided at the position of the minimum width W1, and the top portion TP and the intermediate portion MP may be substantially divided at the position of the width W3, but the invention is not limited thereto.

Figure 1D:
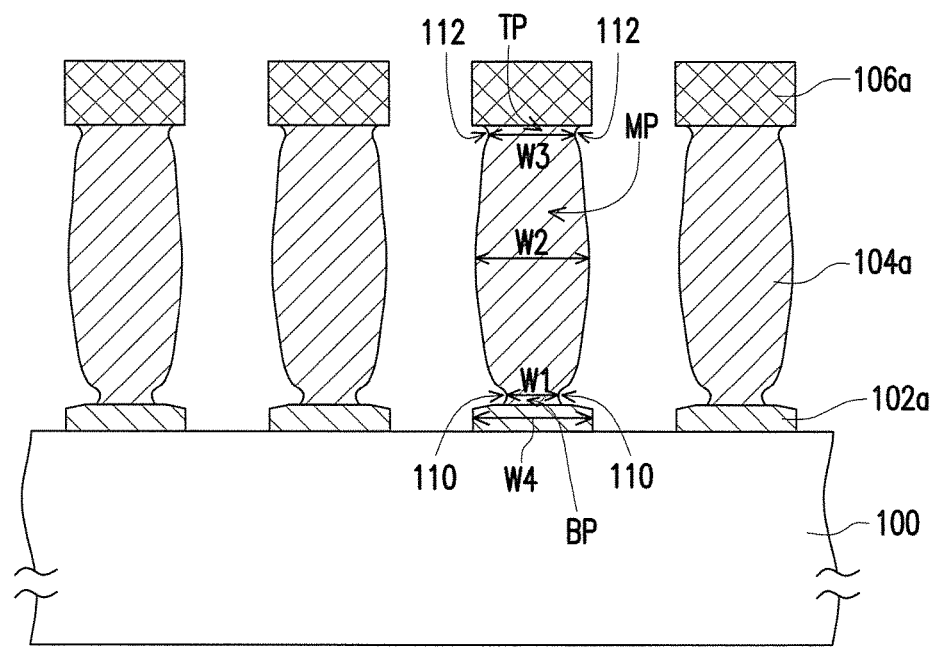

Referring to FIG. 1D, a barrier layer 102a is formed between the conductive pattern 104a and the substrate 100 by removing a portion of the barrier material layer 102 with the patterned mask layer 108 as a mask. A method of removing the portion of the barrier material layer 102 is to perform an etching process (e.g., a dry etching process) on the barrier material layer 102 with the patterned mask layer 108 as a mask, for example. A width W4 of the barrier layer 102a may be greater than the minimum width W1 of the conductive pattern 104a.

In addition, the notch 110 may be adjacent to an interface between the conductive pattern 104a and the barrier layer 102a. For example, the notch 110 may be located at the interface between the conductive pattern 104a and the barrier layer 102a. In another embodiment, the notch 110 may be adjacent to an interface between the conductive pattern 104a and the substrate 100 when the interconnect structure does not include the barrier layer 102a. For example, the notch 110 may be located at the interface between the conductive pattern 104a and the substrate 100.

Thereafter, the patterned mask layer 108 can be removed. A method of removing the patterned mask layer 108 is a dry removing method or a wet removing method, for example. For example, the removing method of the patterned mask layer 108 may be carried out by performing ashing on the patterned mask layer 108 with an oxygen plasma and then removing the ashed residue by a wet cleaning method. In another embodiment, when the patterned mask layer 108 is, for example, the patterned hard mask layer of silicon nitride or silicon oxide, the patterned mask layer 108 may not be removed.

Although the conductive pattern 104a is formed by the aforementioned forming method in this embodiment, it is merely an example and the forming method of the conductive pattern 104a of the invention is not limited thereto.

Figure 1E:
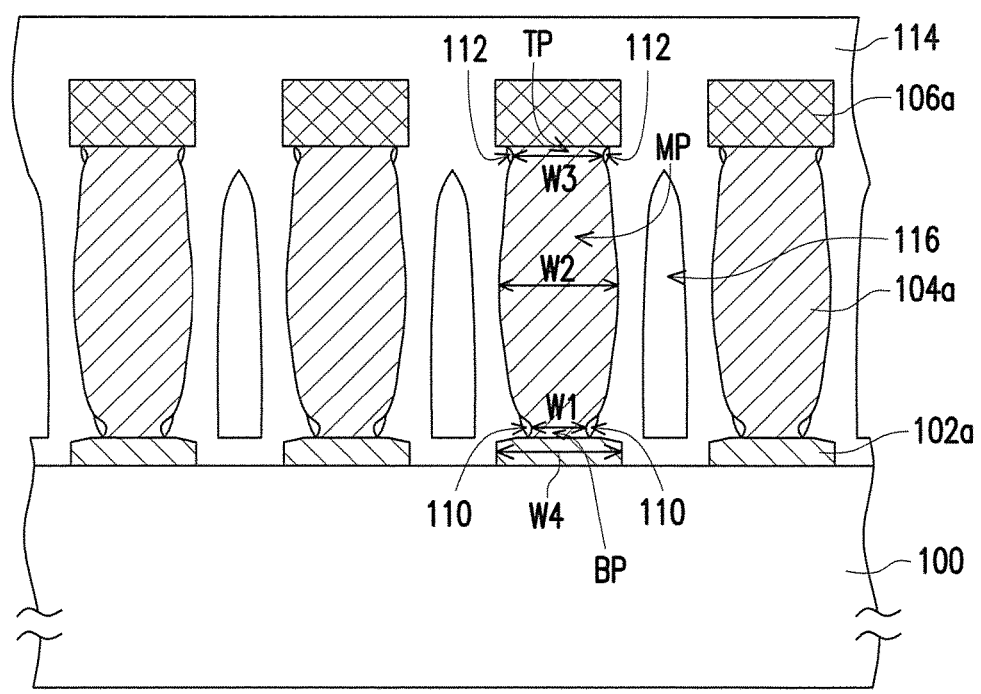

Referring to FIG. 1E, a dielectric layer 114 is formed on the substrate 100 at two sides of the conductive pattern 104a. The notch 110 may be located between the dielectric layer 114 and the conductive pattern 104a. In addition, the dielectric layer 114 may be filled into a portion of the notch 110. Moreover, the notch 112 may be located between the dielectric layer 114 and the conductive pattern 104a, and the dielectric layer 114 may also be filled into a portion of the notch 112. Furthermore, depending on the hole filling capability, a hole 116 may be formed in the dielectric layer 114 between adjacent two conductive patterns 104a. A material of the dielectric layer 114 is silicon oxide, for example. A method of forming the dielectric layer 114 is chemical vapor deposition, for example.

Based on the embodiment described above, the conductive pattern 104a has the notch 110 on each of the two sidewalls of the bottom portion BP. Therefore, the critical dimension (CD) of the bottom portion BP of the conductive pattern 104a is reduced to increase the overlay window of the conductive pattern 104a and the conductive devices below, so as to prevent occurrence of the defect of circuit bridging. In addition, because the portions other than the bottom portion BP of the conductive pattern 104a have greater widths, a larger cross-sectional area is retained to maintain a low resistance and a low resistance capacitance delay (RC delay).

An interconnect structure of this embodiment is described hereinafter with reference to FIG. 1E. Although the interconnect structure may be fabricated by the aforementioned fabricating method in this embodiment, it is merely an example and the fabricating method of the interconnect structure of the invention is not limited thereto.

Referring to FIG. 1E, the interconnect structure includes the substrate 100 and the conductive pattern 104a. The conductive pattern 104a includes the bottom portion BP. The bottom portion BP of the conductive pattern 104a is disposed on the substrate 100. The conductive pattern 104a has the notch 110 on each of two sidewalls of the bottom portion BP. The conductive pattern 104a further includes the intermediate portion MP and the top portion TP. The intermediate portion MP is located between the top portion TP and the bottom portion BP. The conductive pattern 104a may selectively have the notch 112 on each of two sidewalls of the top portion TP. Moreover, the interconnect structure may further selectively include at least one of the barrier layer 102a, the barrier layer 106a, and the dielectric layer 114. The barrier layer 102a is disposed between the conductive pattern 104a and the substrate 100. The barrier layer 106a is disposed on the conductive pattern 104a. The dielectric layer 114 is disposed on the substrate 100 at two sides of the conductive pattern 104a. The hole 116 may be selectively formed in the dielectric layer 114 between adjacent two conductive patterns 104a. Furthermore, the material, arrangement, forming method, and efficiency of each component in the interconnect structure have been specified in the above embodiment of the fabricating method of FIG. 1A to FIG. 1E, and thus are not repeated hereinafter.

To conclude, in the interconnect structure and the fabricating method thereof as described in the above embodiments, the conductive pattern has the notch on each of the two sidewalls of the bottom portion. Therefore, the critical dimension (CD) of the bottom portion of the conductive pattern is reduced to increase the overlay window of the conductive pattern and the conductive devices below, so as to prevent occurrence of the defect of circuit bridging. In addition, because the portions other than the bottom portion of the conductive pattern have greater widths, a larger cross-sectional area is retained to maintain a low resistance and a low resistance capacitance delay (RC delay).

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. An interconnect structure, comprising:
    a substrate;
    a conductive pattern comprising a bottom portion, wherein the bottom portion of the conductive pattern is disposed on the substrate, and the conductive pattern has a notch on each of two sidewalls of the bottom portion; and
    a dielectric layer surrounding the conductive pattern, wherein a hollow is present in the notch and between the conductive pattern and the dielectric layer.

2. The interconnect structure according to claim 1, wherein a position of a minimum width of the conductive pattern is at the notch.

3. The interconnect structure according to claim 2, wherein the conductive pattern further comprises an intermediate portion and a top portion, wherein the intermediate portion is located between the top portion and the bottom portion, and a position of a maximum width of the conductive pattern is at the intermediate portion.

4. The interconnect structure according to claim 3, wherein the position of the maximum width of the conductive pattern is a transition position of a positive slope and a negative slope.

5. The interconnect structure according to claim 2, further comprising a first barrier layer disposed between the conductive pattern and the substrate.

6. The interconnect structure according to claim 5, wherein a width of the first barrier layer is greater than the minimum width of the conductive pattern.

7. The interconnect structure according to claim 5, wherein the notch is located at an interface between the conductive pattern and the first barrier layer.

8. The interconnect structure according to claim 1, further comprising a second barrier layer disposed on the conductive pattern.

9. The interconnect structure according to claim 1, further comprising a dielectric layer disposed on the substrate at two sides of the conductive pattern, wherein the notch is located between the dielectric layer and the conductive pattern.

10. The interconnect structure according to claim 1, wherein a material of the conductive pattern comprises AlCu, Al, or W.

11. A fabricating method of an interconnect structure, the fabricating method comprising:
    providing a substrate;
    forming a conductive pattern on the substrate, wherein the conductive pattern comprises a bottom portion, and the conductive pattern has a notch on each of two sidewalls of the bottom portion; and
    forming a dielectric layer surrounding the conductive pattern, wherein a hollow is present in the notch and between the conductive pattern and the dielectric layer.

12. The fabricating method according to claim 11, wherein a forming method of the conductive pattern comprises:
    forming a conductive pattern material layer on the substrate;
    forming a patterned mask layer on the conductive pattern material layer;
    performing a first etching process on the conductive pattern material layer with the patterned mask layer as a mask, wherein a first etching gas used in the first etching process comprises a $Cl_2$ and a $BCl_3$, and in the first etching process, a flow rate of the $BCl_3$ is less than or equal to a flow rate of the $Cl_2$; and
    performing a second etching process on the conductive pattern material layer with the patterned mask layer as a mask after performing the first etching process, wherein a second etching gas used in the second etching process comprises the $Cl_2$ and the $BCl_3$, and in the second etching process, the flow rate of the $BCl_3$ is greater than the flow rate of the $Cl_2$.

13. The fabricating method according to claim 12, wherein a flow rate ratio of the $BCl_3$ to the $Cl_2$ in the first etching process is 0.3 to 1.

14. The fabricating method according to claim 12, wherein a flow rate ratio of the $BCl_3$ to the $Cl_2$ in the second etching process is 1.3 to 5.

15. The fabricating method according to claim 12, wherein during the second etching process, a process pressure is 2 mTorr to 30 mTorr, a source RF power is 100 W to 1500 W, and a bias RF power is 15 W to 200 W.

16. The fabricating method according to claim 12, wherein the first etching gas and the second etching gas further comprise a protective gas, respectively.

17. The fabricating method according to claim 16, wherein the protective gas comprises $CH_4$, $N_2$, $CF_4$, $CHF_3$, or a combination of the foregoing.

18. The fabricating method according to claim 11, further comprising forming a first barrier layer between the conductive pattern and the substrate.

19. The fabricating method according to claim 11, further comprising forming a second barrier layer on the conductive pattern.

20. The fabricating method according to claim 11, further comprising forming a dielectric layer on the substrate at two sides of the conductive pattern, wherein the notch is located between the dielectric layer and the conductive pattern.

* * * * *